(12) United States Patent
Gevorgyan et al.

(10) Patent No.: US 9,478,844 B2
(45) Date of Patent: Oct. 25, 2016

(54) TUNABLE DELAY LINE ARRANGEMENT

(75) Inventors: Spartak Gevorgyan, Göteborg (SE); Bengt-Erik Olsson, Hovås (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 55 days.

(21) Appl. No.: 14/391,780

(22) PCT Filed: Apr. 17, 2012

(86) PCT No.: PCT/EP2012/057000
§ 371 (c)(1),
(2), (4) Date: Oct. 10, 2014

(87) PCT Pub. No.: WO2013/156058
PCT Pub. Date: Oct. 24, 2013

(65) Prior Publication Data
US 2015/0061790 A1 Mar. 5, 2015

(51) Int. Cl.
*H01P 9/00* (2006.01)
*H03H 7/30* (2006.01)

(52) U.S. Cl.
CPC ...... *H01P 9/00* (2013.01); *H03H 7/30* (2013.01); *H01P 9/003* (2013.01)

(58) Field of Classification Search
CPC ............ H01P 9/00; H01P 9/06; H01P 9/003; H03H 7/30
USPC ........................................................ 333/161
See application file for complete search history.

(56) References Cited

U.S. PATENT DOCUMENTS

| | | | |
|---|---|---|---|
| 5,083,100 A * | 1/1992 | Hawkins | H03H 7/345 333/139 |
| 7,642,883 B2 | 1/2010 | Kuylenstierna et al. | |
| 2008/0048800 A1 | 2/2008 | Dutta | |

FOREIGN PATENT DOCUMENTS

| | | |
|---|---|---|
| JP | 59144204 A | 8/1984 |
| JP | 2010050653 A | 3/2010 |

OTHER PUBLICATIONS

Lujambio A et al: "Dispersive Delay Line With Effective Transmission-Type Operation in Coupled-Line Technology", IEEE Microwave and Wireless Components Letters, IEEE Service Center, New York, NY, US, vol. 21, No. 9, Sep. 1, 2011, pp. 459-461, XP011351932, ISSN: 1531-1309, DOI: 10.1109/LMWC.2011. 2162822.
Laso M A G et al: "Microstrip Chirped Delay Lines based on Photonic Band-Gap Structures", Microwave Conference, 2002. 32nd European, IEEE, Piscataway, NJ, USA, Sep. 23, 2002, pp. 1-4, XP031606122.
Ranzani et al.: "Microwave tunable dispersion compensator for optical fiber systems", Applied Optics, vol. 50, No. 12, Apr. 20, 2011, pp. 1786-1791, XP002688284, cited in the application.

* cited by examiner

*Primary Examiner* — Benny Lee
*Assistant Examiner* — Albens Dieujuste
(74) *Attorney, Agent, or Firm* — Rothwell, Figg, Ernst & Manbeck, P.C.

(57) ABSTRACT

A tunable chirped delay line arrangement (0) configured to operatively propagate a signal and includes a at least one chirped delay line (1) arranged along a reference direction (z) on a dielectric layer (2) arranged on a ground plane (3). The chirped delay line (1) is configured with a smoothly varying width along the reference direction (z), and the arrangement (0) further comprising at least one electronically tunable impedance (5) interconnecting the at least one delay line (1) and the ground plane (3) at at least one location along the reference direction (z) such that the at least one delay line (1) is loaded by the tunable impedance (5).

9 Claims, 8 Drawing Sheets

TUNABLE DELAY LINE ARRANGEMENT

CROSS REFERENCE TO RELATED APPLICATION(S)

This application is a 35 U.S.C. §371 National Phase Entry Application from PCT/EP2012/057000, filed Apr 17, 2012, designating the United States, the disclosure of which is incorporated herein in its entirety by reference.

TECHNICAL FIELD

The present disclosure concerns microelectronic systems in general and in particular tunable chirped delay lines in such systems.

BACKGROUND

So-called chirped delay lines are used for analogue signal recessing, such as microwave pulse compressors, real time (instantaneous) spectrum analyzers, equalizers in fiber optical communication systems etc. There are several and different technical implementations of chirped delay lines. These are all characterized by uniform insertion losses and linear frequency dependence of the group delay, see [1], [2]. A simple prior art micro strip chirped delay line is disclosed in [1] and illustrated in FIG. 1 and FIG. 2. A prior art mechanically tunable delay line is reported in [2] and illustrated in FIG. 3.

In applications, such as equalizers used in optical communications systems, tunable chirped delay lines are required. The mechanical tunable delay line proposed in [2] is bulky, and not cost effective. Even though the tunable delay line proposed in [3] is simple, small, and cost effective, it has no chirped delay time features including linear frequency dependence of the delay time. The last two types of delay lines also suffer from impedance mismatch associated with tuning.

Consequently, there is a need for a tunable chirped delay line, which is small, simple, and cost effective and provide a reduced impedance mismatch as compared to the above mentioned prior art solutions.

SUMMARY

The present disclosure aims to obviate some of the above-mentioned problems, and to provide methods and arrangements according to the included independent claims. Preferred embodiments are defined by the dependent claims.

In a first aspect, the present disclosure presents a tunable chirped delay line arrangement configured to operatively propagate a signal and including at least one chirped delay line arranged along a reference direction on a dielectric layer arranged on a ground plane, and the chirped delay line is configured with a smoothly varying width along the reference direction, Further, the arrangement includes at least one electronically tunable impedance interconnecting the at least one delay line and the ground plane at at least one location along said reference direction such that the at least one delay line is loaded by the tunable impedance.

The present disclosure enables an electronically tunable chirped delay line.

BRIEF DESCRIPTION OF THE DRAWINGS

The invention, together with further objects and advantages thereof, may best be understood by referring to the following description taken together with the accompanying drawings, in which.

DETAILED DESCRIPTION

Throughout the drawings, the same reference numbers are used for similar or corresponding elements. Although the present disclosure mainly concerns chirped delay line arrangements, the present disclosure is equally applicable to non-chirped delay line arrangements.

Figures 1, 2, 3:
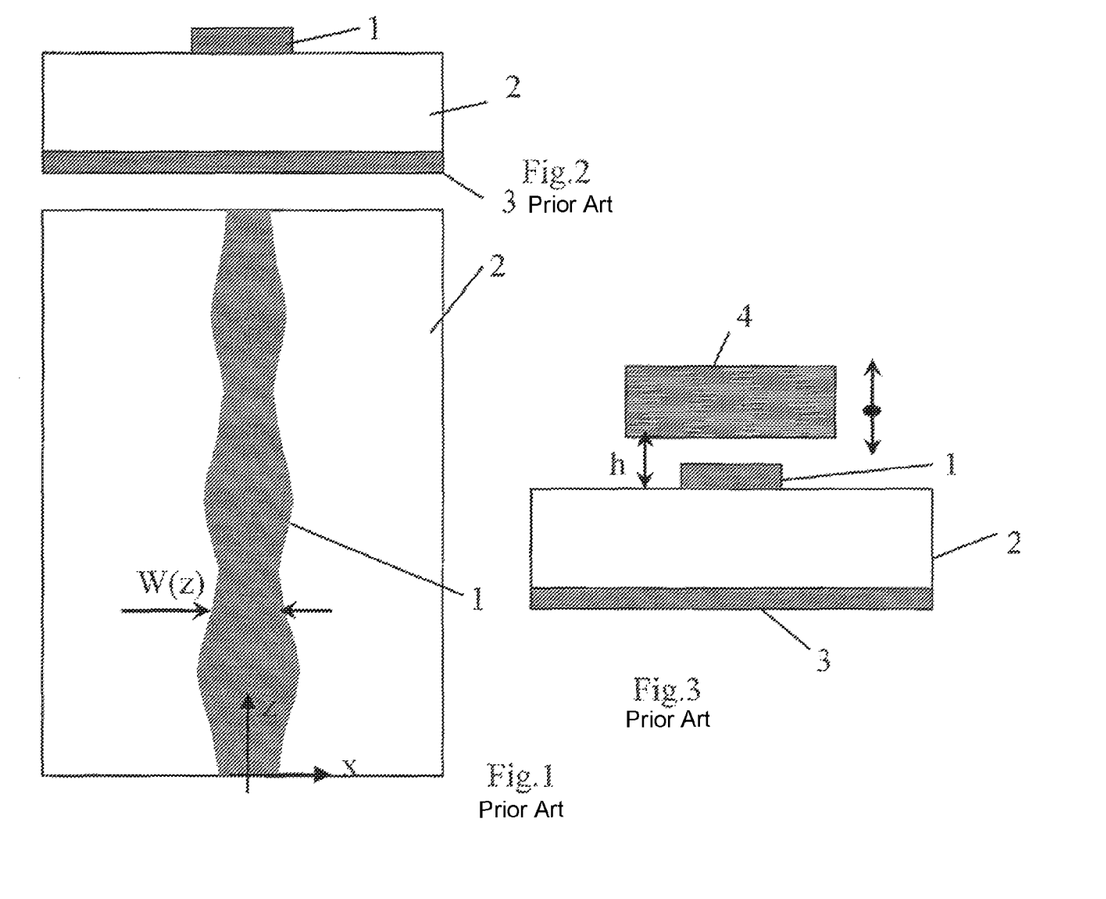
FIG. 1 is an illustration of a known chirped delay line.
FIG. 2 is a cross section of the chirped delay line shown in FIG. 1.
FIG. 3 is a cross section of a known mechanically tunable chirped delay line.

As already mentioned in the background section FIG. 1 and FIG. 2 show the plan view and cross section of the known [1] chirped delay line based on standard micro strip technology. The chirped delay line is not tunable. FIG. 3 shows the known [2] tuning method where a dielectric body 4 is moved up and down to cause changes in the proportion constant of the micro strip and thereby tune the delay time of the chirped delay line. The above-mentioned problems of the thus cited prior art solutions, are obviated by the teachings of the current disclosure. In particular, the current disclosure provides a small, integration friendly, electronically controlled and cost effective tunable chirped delay line with improved matching. This is provided by the inventive use of electronically loaded impedances distributed along a reference direction of a chirped delay line.

In this disclosure, small size, integration friendly, electronically controlled and cost effective tunable chirped delay line arrangements with improved matching are proposed. The proposed arrangements utilize standard transmission lines e.g. delay lines used in microwave integrated circuits, such as micro strip, coplanar, coplanar strip, strip line or similar. The cross sectional sizes, i.e. the widths of the involved strips or dielectrics, are smoothly varying functions along the propagation direction. These chirped delay lines may be periodically loaded by lumped electronically tunable impedances such as semiconductor, ferroelectric, MEM (Micro Electro Mechanical) varactors etc. Periodically loaded may imply that a number of impedances are arranged one after the other with substantially the same distance between two adjacent impedances, or different distances between two adjacent impedances. The impedance of these loading components is preferably tuned by external stimuli, preferable voltage. The sizes of the tunable loading impedances are smaller than the wavelength, $\lambda_g$, in the transmission line, preferably less than $0.1\lambda_g$. Some of the lines, such as coplanar, coplanar strip and alike may have distributed ferroelectric or magnetic layers that change their dielectric or magnetic properties under external stimuli, like voltage applied between the strip or magnetic field. In the cross sectional areas of the lines where the tunable lumped element impedances are connected, the cross sectional sizes are optionally altered so that the impedance of these areas remain close to the impedance required in the chirped delay line. In this way the in and output impedance matching conditions of the delay line are maintained.

Figure 4:
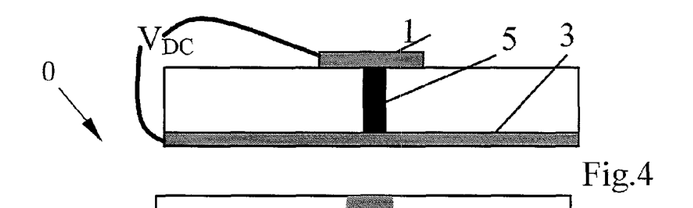
FIG. 4 is a cross section of an embodiment of an arrangement according to the present disclosure.
Figure 5:
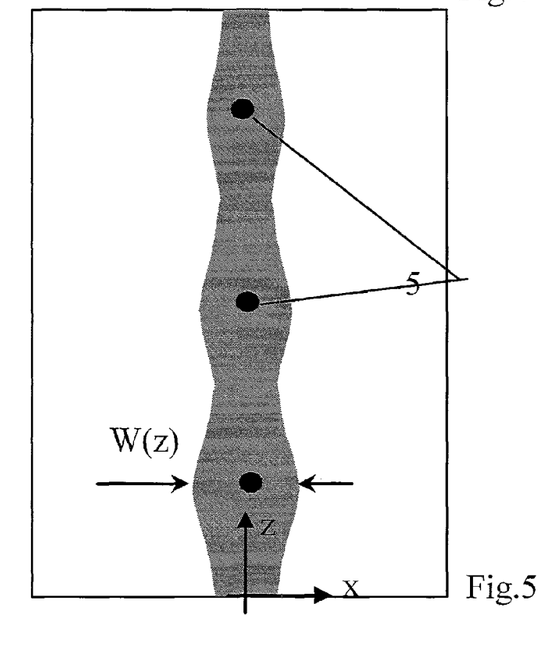
FIG. 5 is a top view of the embodiment in FIG. 4.
Figure 6:
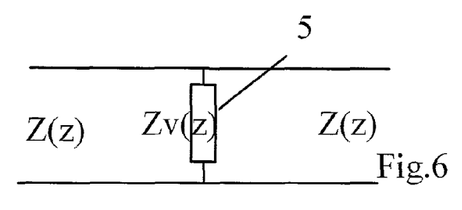
FIG. 6 is a circuit diagram of the embodiment in FIG. 4 and FIG. 5.

With reference to FIG. 4 and FIG. 5, and FIG. 6, an embodiment of a tunable chirped delay line arrangement 0 according to the present disclosure will be described. The arrangement 0 is configured to operatively propagate a signal and includes at least one chirped delay line 1 arranged along a propagation direction or reference direction z on a dielectric layer 2 arranged on a ground plane 3. The delay line 1 is further configured with a smoothly varying width along the reference direction z. This is visualized by the undulating shape of the delay line in FIG. 5. In addition the arrangement 0 further comprises at least one electronically tunable impedance 5 which is configured to interconnect the at least one delay line 1 and the ground plane 3 at one or more locations along the reference direction z such that the at least one delay line 1 is loaded by the tunable impedance 5.

The tunable impedances 5 can comprise varactors or other electronically tunable impedances. Further, as illustrated in FIG. 5, the impedances 5 can be located at the widest locations of the delay line, or at the narrowest locations, or at some location in between. Depending on the desired design, the impedances 5 can be distributed evenly along the reference direction, or have a more irregular distribution. In a similar manner, the size of the individual impedances 5 can be uniform or diverse depending on the specific application.

Along the propagation direction z e.g. the reference direction z the strip width, W(z), of the chirped delay line 1 is optimized to get the desired local line impedances Z(z) and linear frequency dependence of the delay time Δτ as it is disclosed in [1] according to Equations (1)-(4) below:

$$Z(z) = Z_o \exp\left\{A(z)\left[1 + \sin\left(\frac{2\pi}{a_o}z + Kz^2 - K\frac{L^2}{4}\right)\right]\right\} \quad (1)$$

$$K = \frac{4\pi\varepsilon_{\textit{effZo}}}{sc_o^2} \quad (2)$$

$$a_o = \frac{c_o}{2f_o\sqrt{\varepsilon_{\textit{effZo}}}} \quad (3)$$

$$L \geq \frac{c_o s\Delta\omega}{4\pi\sqrt{\varepsilon_{\textit{effZo}}}} \quad (4)$$

where $c_o$ is light velocity in vacuum, $f_o$ is the centre frequency, and $\Delta\omega$ is the bandwidth, $\varepsilon_{\textit{effZo}}$ is the effective permittivity of the input/output transmission lines (e.g. regular micro strip), and is the desired slope (time delay Δτ over the bandwidth Δω) of delay time:

$$s = \Delta\tau/\Delta\omega s/Hz \quad (5)$$

A(z) is given by:

$$A(z) = \exp\left[-4\left(\frac{z - 0.25L}{L}\right)^2\right] \quad (6)$$

Figure 8:
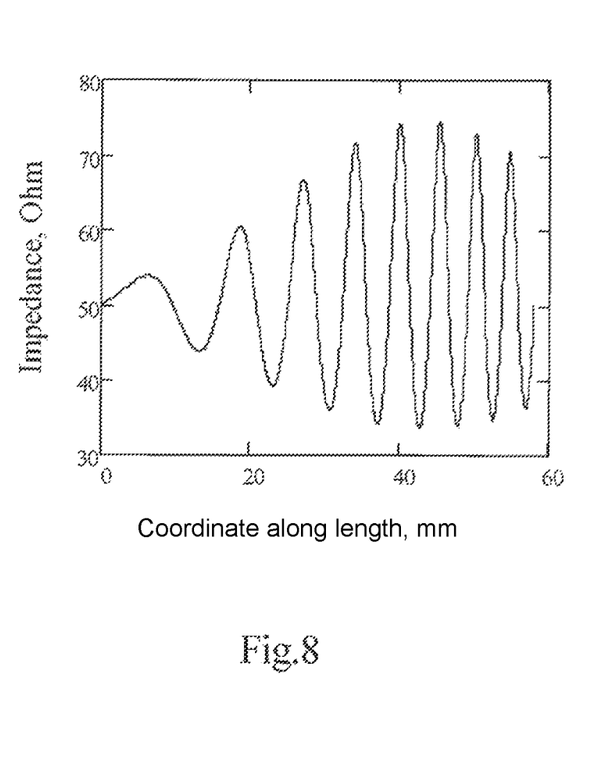
FIG. 8 is a graph illustrating the impedance variation along the reference direction of an embodiment.
Figure 9:
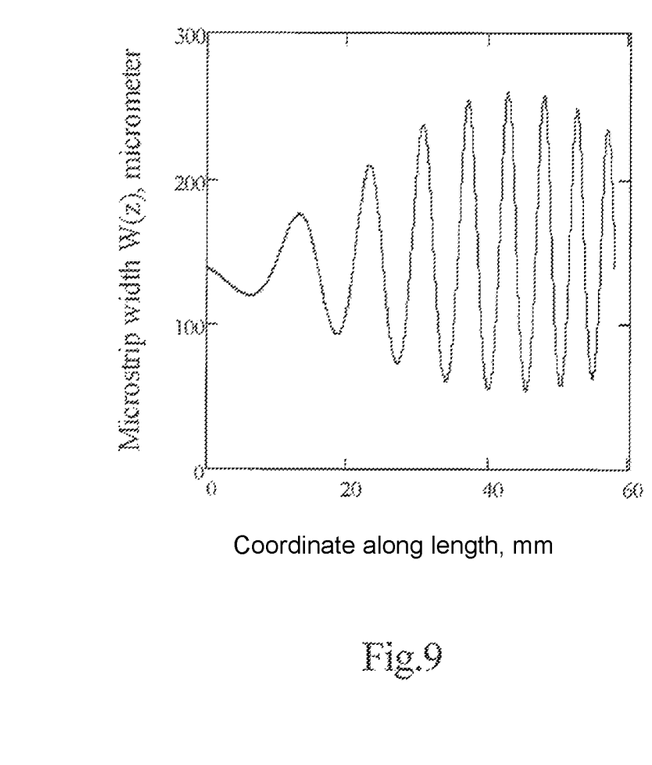
FIG. 9 is a graph illustrating the width variation along the reference direction of an embodiment.

For a given centre frequency, bandwidth, and slope of the delay time, the impedance distribution along the delay line is defined by Equation (1). The delay line 1 with this impedance distribution may be implemented using different transmission lines. The embodiment in FIG. 5 exemplifies implementation in the form of a micro strip line. In this case the strip width distribution that produces a desired impedance, Z(z), distribution may be found using Equation 7 below $$W(z) = \frac{5.98h}{0.8}\exp\left[-\frac{0.67(\varepsilon + 1.41)}{25.4 C'_o(z)}\right] - t \quad (7)$$

where h is the thickness and $\in$ is the permittivity of the substrate, t is the thickness of the strip. In the case of other line types (coplanar, coplanar strip etc.), the width may be calculated by using either well known closed form formulas or using numerical methods. Determination of the width distribution (i.e. Equation (7) for a micro strip line) completes the design of the non-tunable delay line. FIG. 8 shows an example of impedance distribution. FIG. 9 shows the width distribution of a micro strip that produces the impedance distribution shown in FIG. 8. The parameters used in FIG. 8 and FIG. 9 is:

Substrate $\in$=9.6, h=125 mm $f_{max}$15 GHz, $f_{min}$=3 GHz, fo=9 GHz

ατ=4ns $a_o$=7.24 mm $L_\alpha$=8$a_o$=58 mm $C_{ch}$=13940 m$^{-2}$

According to the present disclosure, the chirped delay line arrangement 0 is tunable. Consequently, to make the chirped delay line arrangement 0 tunable, according to the embodiments of this disclosure, the delay line 1 is periodically loaded by impedances e.g. varactors 5 (semiconductor, MEM (Micro Electro Mechanical), ferroelectric etc.). The capacitance $C_v$ of the varactor 5 at a given location z along the reference direction z is calculated using Equation 8 below.

$$C_v(z) = C'(z) - C_o(z)[F/m] \quad (8)$$

$$C'(z) = \frac{sKC'(zo)P(z)}{sK - 2L'_oC'(zo) - 2L'_oC'(zo)P(z)}, [F/m] \quad (9)$$

with $$P(z) = \left[\frac{\pi + Ka_oz}{\pi + Ka_oz_o}\right]^2$$

where $z_o$=0, K, L and s are given by Equations (2), (4) and (5) respectively. For the given line type the line capacitance $C_0(z)$ distribution (per unit length) may be calculated using the impedance distribution in Equation (1). In the case of a micro strip:

$$C_o(z) = \frac{0.67(\varepsilon + 1.41)}{25.4\ln\left[\frac{5.98h}{0.8W(z)}\right]} \, [\text{pF/mm}] \quad (10)$$

Figure 10:
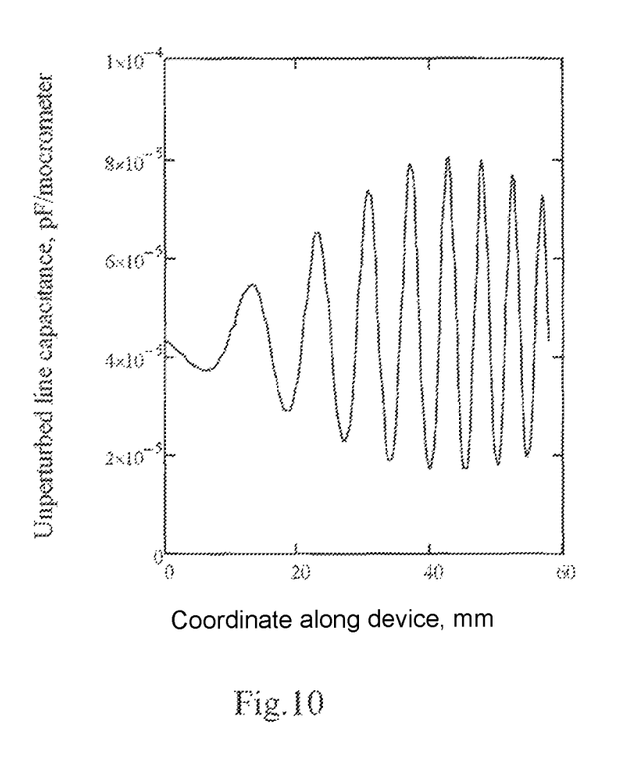
FIG. 10 is a graph illustrating the capacitance variation along the reference direction of an embodiment.
Figure 11:
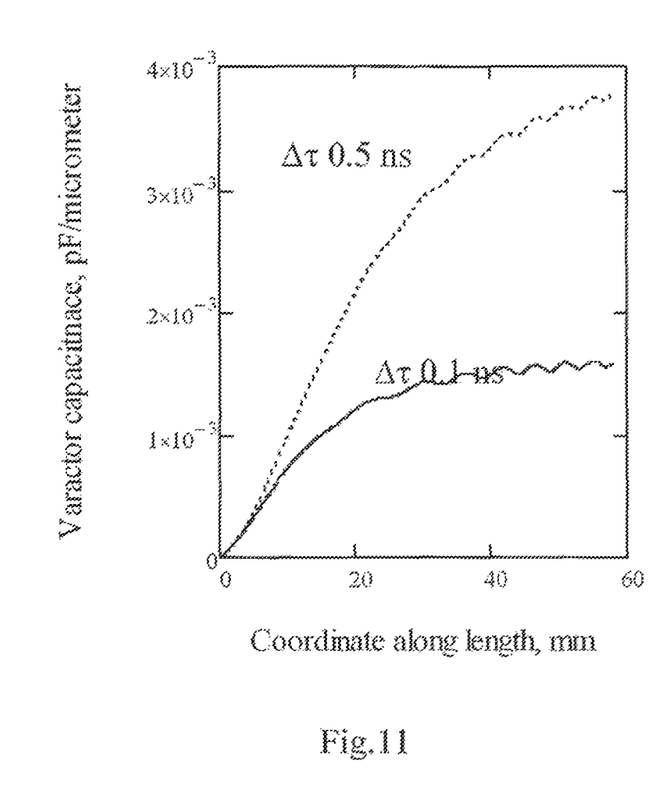
FIG. 11 is a graph illustrating the varactor capacitance along the reference direction of an embodiment.

FIG. 10 shows the distribution of the micro strip capacitance $C_0(z)$ calculated using Equation (10) and FIG. 11 shows the capacitance $C'(z)$ calculated using Equation (8) for the example considered above.

Figure 7:
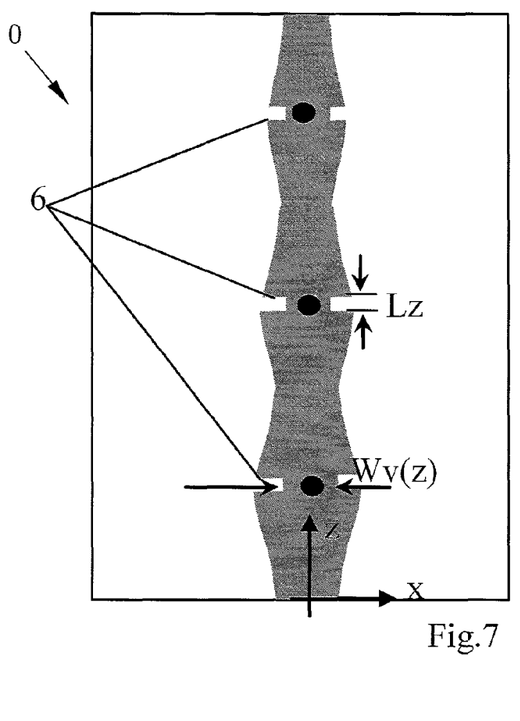
FIG. 7 is a further embodiment of an arrangement.

The distance between the neighboring varactors, as indicated in FIG. 7, is according to a particular embodiment less than $\Delta z < c_o [8f \sqrt{\in_{\mathit{eff}}(z)}]^{-1}$ where $c_o$ is the light velocity in vacuum, $f_o$ is the centre frequency of the desired bandwidth, $\in_{\mathit{eff}}(z)$ is the average effective permittivity at the given location. The minimum $C_v(\Delta\tau_{min}, z)$, and maximum $C_v(\Delta\tau_{max}, z)$, capacitances of the varactors (tunability) are defined for minimum and maximum slopes, s, using Equations (8) (9) and (10).

With reference to a further embodiment, in order to reduce the impedance mismatch while tuning the varactor capacitance, according to this disclosure, the capacitance of the transmission line (for example $C_0$ in Equation (10)) $C_0$ is locally reduced at a location coinciding with at least one of the electronically tunable impedances 5. According to particular embodiment, the line capacitance is reduced according to Equation 11 by the amount:

$$C_v^{average}(z) = L_z\sqrt{C_v(\Delta\tau_{max}, z) \cdot C_v(\Delta\tau_{min}, z)} \quad (11)$$

This can be enabled by locally reducing the width of the strip W, FIG. 7. In Equation (11) $L_z$ is the width of the varactor 5 along the reference direction z, FIG. 7. In the case of micro strip exemplified above, the reduced width $W_v(z)$ at location z is determined by Equation 12 below.

$$W_v(z) = \frac{5.98h}{0.8}\exp\left[-\frac{0.67(\varepsilon + 1.41)}{25.4 C_v^{average}(z)}\right], \, [\mu m] \quad (12)$$

The respective width of the plurality of impedances 5 is preferably smaller than a local wavelength of the signal propagating in the at least one transmission line 1. In addition, width reduction 6 at a predetermined location is of the same order of magnitude as a width of co-located impedance 5. The local width reduction 6 may be overlaid the smoothly varying width of the chirped delay line. For example, the width reduction 6 may be done in addition to the smoothly varying width of the chirped delay line and/or it may have the same or a different periodicity compared to a possible periodicity of the smoothly varying width.

Figure 12:
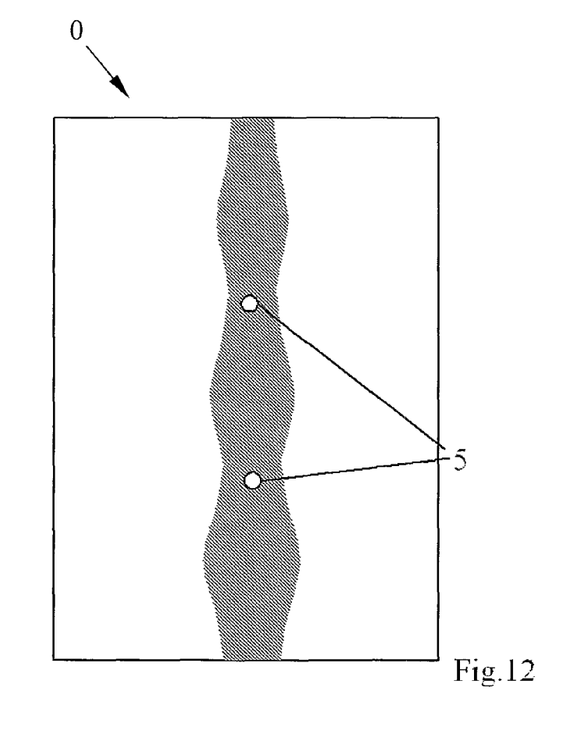
FIG. 12 illustrates an embodiment according to the present disclosure.
Figure 13:
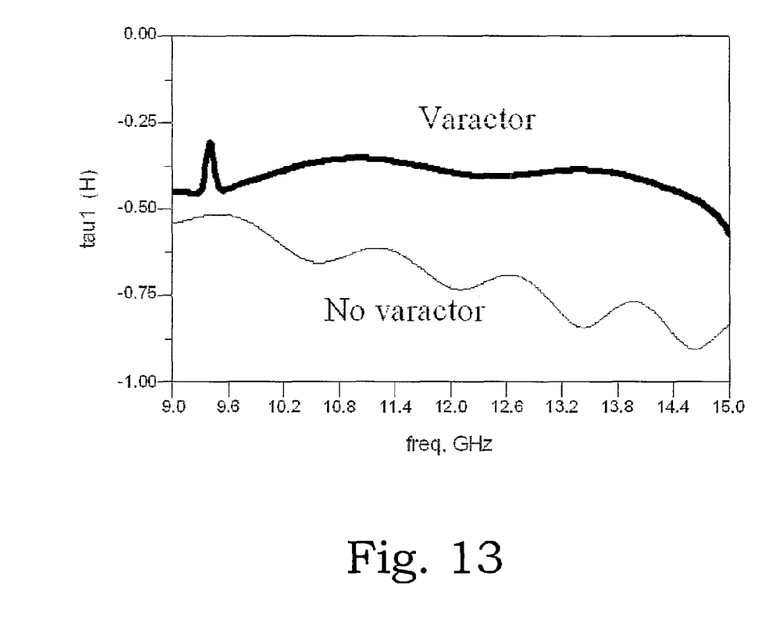
FIG. 13 is a graph illustrating a comparison of the frequency vs. delay time for the embodiment in FIG. 12, with and without varactors.

With reference to FIG. 12, an example of an embodiment of a tunable chirped delay line arrangement according to the current disclosure will be described. The embodiment comprises a chirped delay line 1 with two varactors e.g., impedance loads 5 at locations where the width of the delay line 1 has local minimums widths. In FIG. 13, the frequency dependence of the delay time of the micro strip in FIG. 12 is plotted without and with loading varactors 5 located only in the narrow parts of the micro strip.

Figure 14:
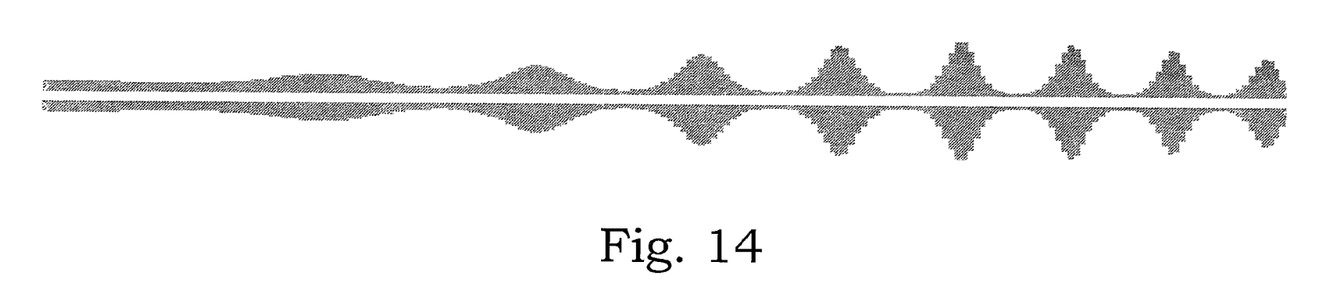
FIG. 14 is an embodiment of an arrangement.
Figure 15:
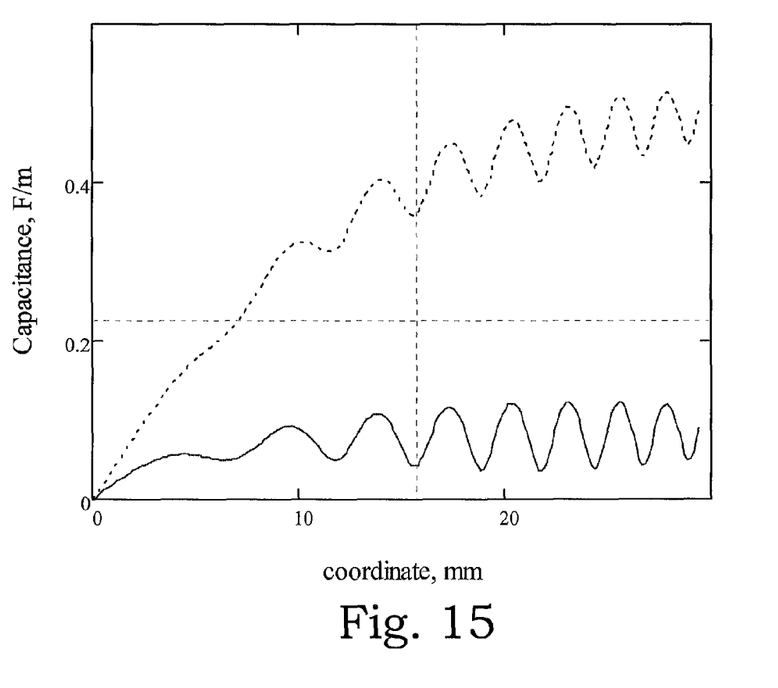
FIG. 15 is a graph illustrating the varactor capacitance vs. location along the reference direction, according to an embodiment.

Another example is shown in FIG. 14. In this case coplanar strip design is considered using a 250 μm thick substrate with $\in=38$. The complete length of the device is less than 30 mm. The distribution of the varactor capacitance for time delays 1.5 and 5 ns is shown in FIG. 15. The problem with this and similar designs is that varactors with capacitances ranging from 0 to 0.5 pf/mm (as an example) are required, FIG. 15. From the cost perspective and from the point of view of complexity of the DC bias circuit, it is desired to use only one type of varactor along the length of the line. In the case of the example shown in FIG. 14 the required maximum capacitance of the varactor is $C_v(z=L)=0.5$ pF, assuming a varactor having width 350 mm. If such a varactor used along the whole length of the line, the required capacitance distribution, FIG. 15 may not be achieved, or even if it is possible to achieve a complex DC bias electronics is needed to bias each of the varactor individually.

Figure 16:
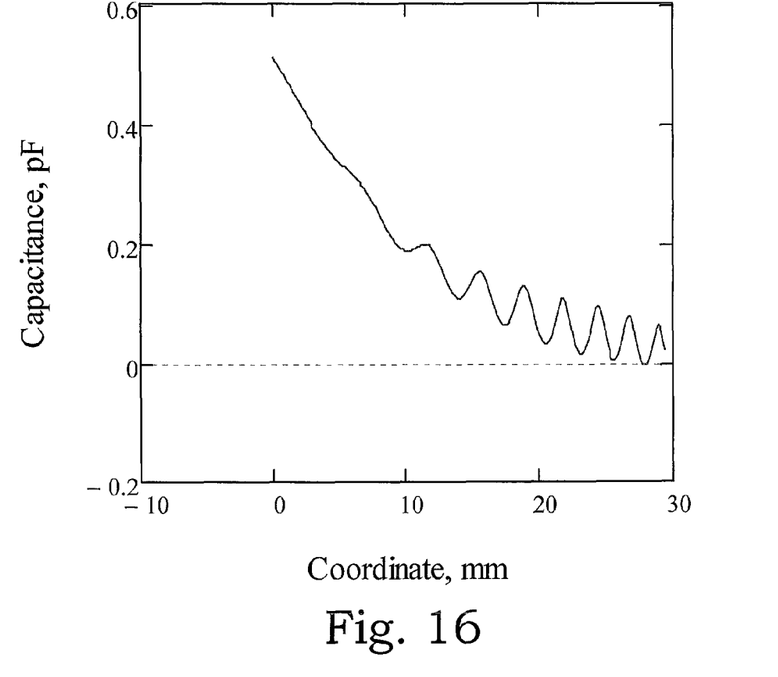
FIG. 16 is a graph illustrating the delay line capacitance vs. location along the reference direction according to an embodiment.
Figure 17:
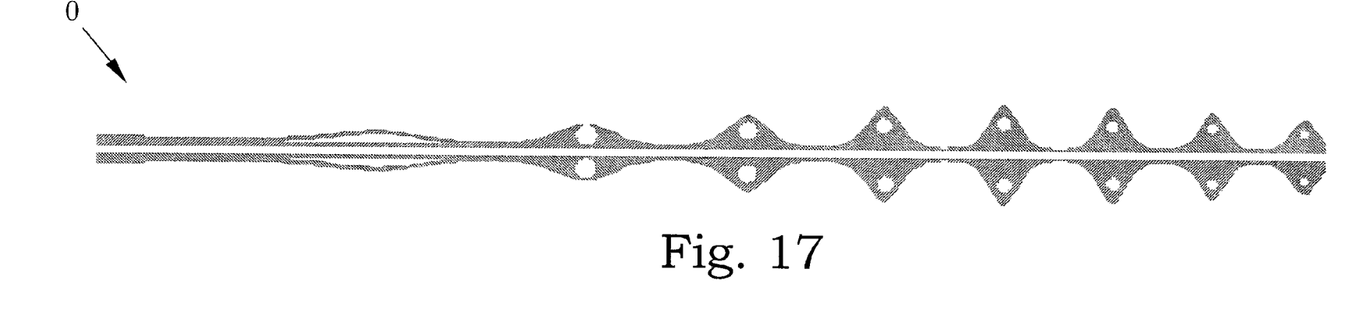
FIG. 17 is an embodiment with the delay line capacitance according to FIG. 16.
Figure 18:
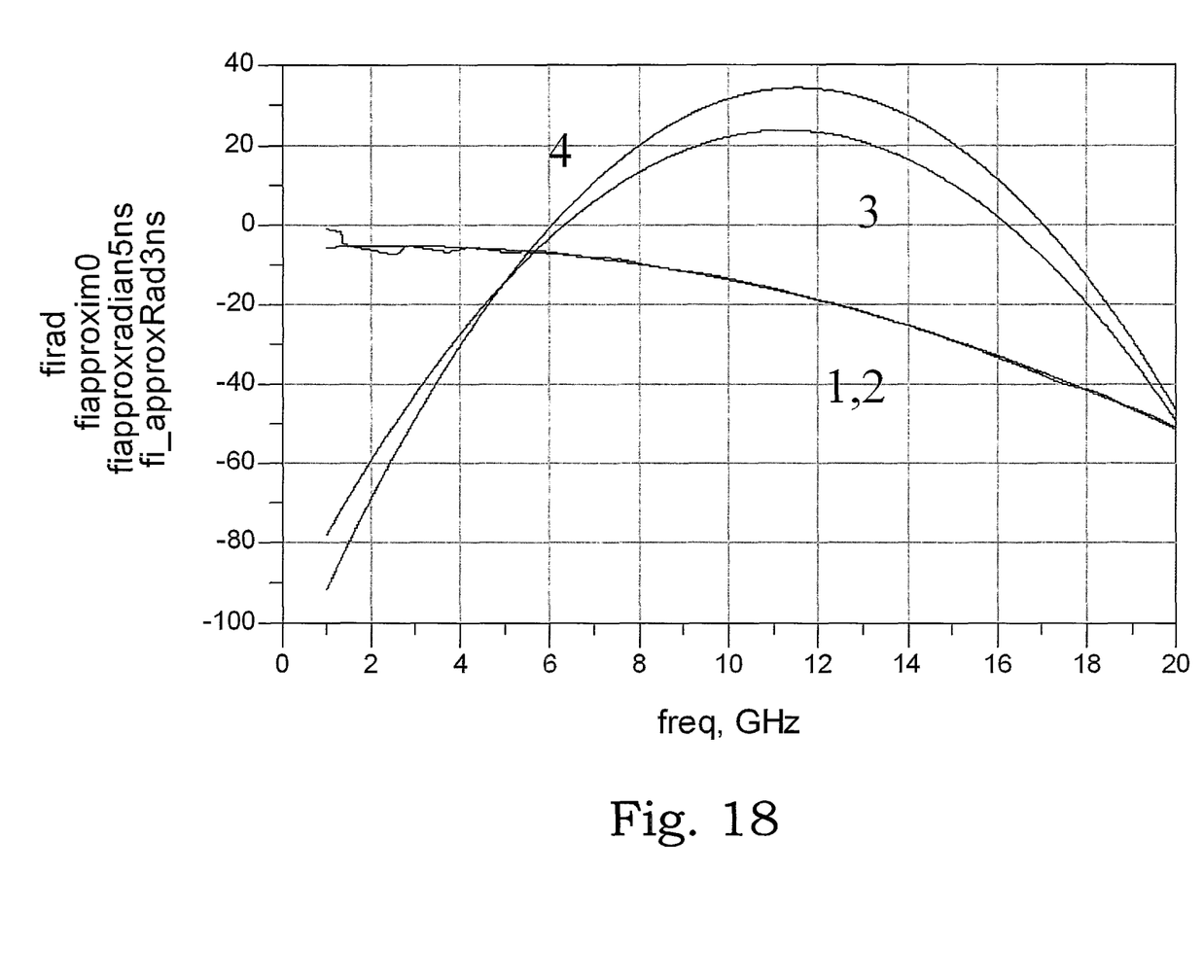
FIG. 18 is a graph illustrating the frequency dependence of the phases of the embodiment in FIG. 14, with and without varactors.

Consequently, and with reference to FIG. 17, an embodiment of a tunable chirped delay line with simplified design is disclosed. By selectively reducing the area of each strip comprising the co planar strip line at select locations, it is possible to enable using a same size impedance at all locations, thereby also simplifying the tuning procedure. To overcome the problem and to maintain the required capacitance distribution, in this disclosure, the capacitance of the line is reduced by the amount $\Delta C(z) = C_o(Z) - C_v(z=L)$, FIG. 16, via removing parts of the strip with the area proportional to $\Delta(C(z))$, as shown in FIG. 17. The impact on the frequency dependences of the phases for the line shown in FIG. 14 without varactors ($\Delta\tau=5$ ns) and with varactors in the narrowest places of the strips providing 2.1 ns and 0.7 ns time delays are illustrated in FIG. 18.

It should be clear that other transmission line types such as micro strip, coplanar waveguide or a coplanar strip line could be easily adapted within the present disclosure. Further, the tunable impedance 5 can comprise a flip chip or wire bond connected impedance. In addition, the tunable impedance 5 can be monolithically integrated in a semiconductor substrate or comprise as a thin film deposited on a dielectric or semiconductor substrate. Finally, the 1 tunable impedance 5 can be selected from the group comprising semiconductor, ferroelectric, MEMs varactors. In addition, the tunable impedance 5 can be configured to be electronically tuned by an externally applied voltage.

Advantages of the present disclosure include enabling electronic tuning of the delay time of a chirped delay line arrangement and improved impedance matching. Furthermore, the reshaping of the strips allowing use of the same type of varactors along the line simplifies the DC biasing network (only one DC tuning voltage is used for all varactors) and makes it more cost effective In summary, the delay line arrangements according to the present disclosure are cost effective, since they have simple design and may be implemented as hybrid and monolithic integrated circuits. In the former case the loading tunable impedances are flip chip or wire bond connected, in the latter case they may be monolithically integrated in semiconductor substrate (i.e. varactors) or as a thin film deposited (i.e. ferroelectric film) on a dielectric or semiconductor substrate.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

REFERENCES

[1] M A G Laso et al, "Chirped Delay Lines in Microstrip Technology", IEEE MICROWAVE AND WIRELESS COMPONENTS LETTERS, VOL. 11, NO. 12, DECEMBER 2001, pp. 486
[2] L. Ranzani et al, "Microwave tunable dispersion compensator for optical fiber systems", APPLIED OPTICS/Vol. 50, No. 12/20 Apr. 2011, p. 1786
[3] D Kuylenstierna et al, Tunable ferroelectric delay line having mirror image conductors, U.S. Pat. No. 7,642,883 B2, Jan. 5, 2010

The invention claimed is:

1. A tunable chirped delay line arrangement configured to operatively propagate a signal and including at least one chirped delay line arranged along a reference direction on a dielectric layer arranged on a ground plane wherein said chirped delay line is configured with a smoothly varying width along said reference direction, and wherein said arrangement further comprises a plurality of electronically tunable impedances interconnecting said at least one delay line and said ground plane at a plurality of locations along said reference direction such that said at least one delay line is periodically loaded by said plurality of electronically tunable impedances,
wherein a capacitance of said at least one delay line along said reference direction is reduced at a location within said plurality of locations coinciding with at least one of said plurality of electronically tunable impedances.

2. The arrangement according to claim 1, wherein at least one tunable impedance of said plurality of electronically tunable impedances is selected from a group comprising semiconductor, ferroelectric, and MEMs varactors.

3. The arrangement according to claim 1, wherein at least one tunable impedance of said plurality of electronically tunable impedances is configured to be electronically tuned by an externally applied voltage.

4. The arrangement according to claim 1, wherein the width of said at least one delay line is reduced at said location within said plurality of locations coinciding with at least one of said plurality of electronically tunable impedances.

5. The arrangement according to claim 4, wherein said reduced width at a predetermined location within said plurality of locations is of the same order of magnitude as a width of an adjacent impedance of said plurality of electronically tunable impedances.

6. The arrangement according to claim 1, wherein a respective width of said plurality of electronically tunable impedances is smaller than a wavelength of said signal propagating in at least one transmission line.

7. The arrangement according to claim 1, wherein said at least one delay line comprises one of a micro strip, coplanar waveguide and a coplanar strip line.

8. The arrangement according to claim 1, wherein at least one tunable impedance of said plurality of electronically tunable impedances comprises a flip chip or wire bond connected impedance.

9. The arrangement according to claim 1, wherein at least one tunable impedance of said plurality of electronically tunable impedances is monolithically integrated in a semiconductor substrate or as a thin film deposited on a dielectric or semiconductor substrate.

* * * * *